United States Patent [19]

Wine

[11] Patent Number: 4,521,916
[45] Date of Patent: Jun. 4, 1985

[54] FREQUENCY SYNTHESIS TUNING CONTROL SYSTEM FOR A DOUBLE-CONVERSION TUNER

[75] Inventor: Charles M. Wine, Mercer County, N.J.

[73] Assignee: RCA Corporation, Princeton, N.J.

[21] Appl. No.: 556,356

[22] Filed: Nov. 29, 1983

[51] Int. Cl.³ .............................................. H04B 1/26
[52] U.S. Cl. .................................... 455/182; 455/260; 455/316; 455/183; 331/22; 331/25
[58] Field of Search ............... 455/182, 183, 207, 209, 455/258-260, 314-316; 331/2, 22, 25

[56] References Cited

U.S. PATENT DOCUMENTS

| | | | |
|---|---|---|---|
| 2,882,394 | 4/1959 | Mortley . | |
| 4,152,669 | 5/1979 | Igarashi | 455/316 |
| 4,184,068 | 1/1980 | Washburn | 455/183 |
| 4,340,974 | 7/1982 | Cooke et al. | 455/258 |
| 4,451,930 | 5/1984 | Chapman et al. | 455/316 |

OTHER PUBLICATIONS

"Frequency Stabilization of Communication Receivers" by Nield, Conference on Radio Receivers and Asso. Systems, 7-1978.
Past, Present and Future Trends of TV Tuner Design in Europe, by J. H. Schuermann, published in the *IEEE Transactions on Consumer Electronics*, May 1977.

Primary Examiner—Jin F. Ng
Attorney, Agent, or Firm—Eugene M. Whitacre; Paul J. Rasmussen; Peter M. Emanuel

[57] ABSTRACT

The tuning control system of a double-conversion tuner includes a phase locked loop type of frequency synthesizer for controlling the frequency of a controllable oscillator comprising the first local oscillator of the double-conversion tuner according to the frequency deviation of the difference between the frequencies of the first and second local oscillators from a reference frequency in order to compensate for the drift of either one of the local oscillators. An up/down counter which counts in one sense in response to the first local oscillator signal and in the other sense in response to the other local oscillator signal is used to generate the frequency difference signal. Because the frequency of the first local oscillator is always greater from the frequency of the second local oscillator the up/down counter can be implemented in the form of a simple pulse swallower.

15 Claims, 3 Drawing Figures

FREQUENCY SYNTHESIS TUNING CONTROL SYSTEM FOR A DOUBLE-CONVERSION TUNER

The present invention concerns a frequency synthesis tuning control system for a double-conversion tuner and more particular to one which is responsive to the difference frequency of the two local oscillators of the double-conversion tuner.

A double-conversion tuner includes a first mixer for heterodyning a received RF signal and a first local oscillator signal to produce a first IF signal (so called even though it is in the RF range) and a second mixer for heterodyning the first IF signal and a second local oscillator signal to produce a second IF signal. The second IF signal has the same frequency range as the IF signal produced by a conventional single-conversion tuner. The selection of the frequency range of the first IF signal provides a degree of freedom by which the interference of many unwanted signals resulting from the heterodyning process, such as image frequency signals, can be avoided. The frequency of the first local oscillator is set in accordance with the selected station or channel so that the first IF signal has the desired frequency range and the frequency of the second local oscillator is set at a nominally fixed value selected so that the second IF signal has the conventional frequency range (i.e., the same as that produced by a conventional single-conversion tuner).

The first local oscillator often is controlled by a closed loop frequency synthesizer such as a phase or frequency locked loop by which the frequency of the first local oscillator signal is locked to a reference frequency such as may be provided by a crystal oscillator. Accordingly, the frequency of the first local oscillator is very accurate and stable. However, the second local oscillator is typically free running. Therefore, unless the second local oscillator is a very stable oscillator such as a crystal oscillator, its frequency may drift which may cause corresponding frequency errors in the second IF signal. Very stable frequency oscillators are expensive and, therefore, it is desired to avoid their use whenever possible.

In order to stabilize the frequency of the second local oscillator against frequency drift, it has been proposed to employ an analog mixer to mix (i.e., "beat") the first and second local oscillator signals to produce a difference frequency signal and a frequency synthesizer which generates a control signal for the first local oscillator in accordance with the deviation between the frequency of the difference frequency signal and the frequency of a reference frequency signal. The control signal controls the frequency of the first local oscillator to cause the difference frequency to be at a nominal value. Thus, frequency errors in either one of the two local oscillators are compensated for.

Unfortunately, there are problems associated with using a conventional analog mixer in the above-identified type of frequency difference synthesizer. For example, the local oscillator signal produced by one local oscillator may be coupled through the mixer to the other local oscillator which tends to produce unwanted beat components in the IF signal produced by the tuner. This necessitates the use of buffer stages. Furthermore, since the output signal levels of the two local oscillators are relatively low and the gain of a typical analog mixer is less than unity, amplification stages may additionally be required to compensate for the mixer loss.

The present invention concerns a frequency synthesizer for stabilizing both local oscillators of a double-conversion tuner against drift which digitally generates a difference frequency signal and does so simply. Specifically, in accordance with an aspect of the present invention, a difference frequency synthesizer for a double-conversion tuner includes an up/down counter having first and second inputs for counting in one (e.g., increasing) sense in response to pulses applied to the first input and for counting in the opposite (e.g., decreasing) sense in response to pulses applied to the second input. The output of the first local oscillator is coupled to the first input of the counter and the output of the second local oscillator is coupled to the second input of the counter. An output signal of the counter representing the frequency difference between the first and second local oscillators is compared to a reference value corresponding to the nominal frequency difference between the two local oscillators to produce a control signal for one of the local oscillators, preferably the first which is typically already controllable for channel selection purposes.

In a preferred embodiment of the present invention, the counter comprises a "pulse swallower" coupled between one of the inputs of the counter and its output. The pulse swallower is responsive to the pulses applied to the other input for selectively removing ("swallowing") a predetermined number of pulses applied to the first mentioned input and coupling the remainder to the output.

As a further aspect of the invention, fixed frequency dividers or "prescalers", which divide by the same division factor, preceed the two inputs of the up/down for reducing frequencies of its input signals and also for isolating (or "buffering") the two local oscillators from one another.

These and other features of the invention will be described with reference to the accompanying Drawing in which.

Figure 1:
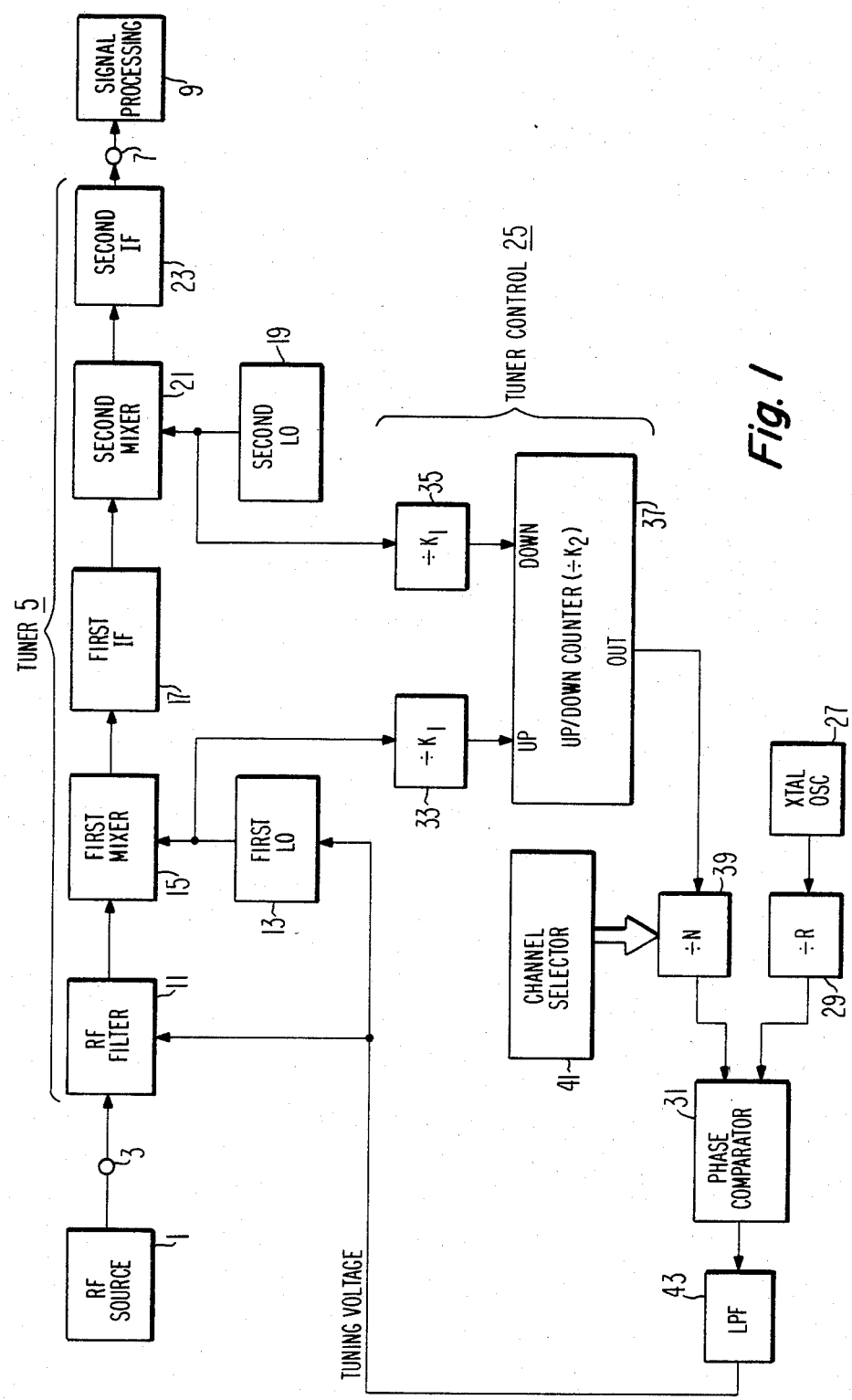
FIG. 1 is a schematic diagram, in block form, of a tuning system for a television receiver constructed in accordance with the present invention.

In the television receiver shown in FIG. 1, a source of RF television signals 1, which may, e.g., be a broadcast receiving antenna or cable distribution network, provides RF television signals corresponding to respective TV channels to input terminal 3 of a tuner 5. Tuner 5 selects the RF signal corresponding to a selected channel and heterodynes it to produce a corresponding IF signal at output terminal 7 of tuner 5. The IF signal is coupled to a signal processing section 9 which demodulates the picture, sound and color carriers of the IF signal to produce respective baseband responses.

Tuner 5 is a double-conversion tuner. Tuner 5 includes a voltage controlled RF filter stage 11 for selecting the particular RF signal corresponding to the selected channel, a first local oscillator 13 comprising a voltage controlled oscillator for generating a first local oscillator signal having a frequency corresponding to the selected channel and a first mixer 15 for heterodyning the selected RF signal and the first local oscillator signal to produce a first RF signal. A first IF filter 17 having a passband corresponding to the frequency difference product of first mixer 13 filters the first IF signal. The filtered first IF signal produced by first IF filter 17 and a second local oscillator signal having a nominally fixed frequency generated by a second local oscillator 19 are heterodyned by a second mixer 21 to produce a second IF signal. A second IF filter 23 having a passband corresponding to the frequency difference product of second mixer 21 filters the second IF signal to produce the IF output signal of tuner 5.

By way of example, in the United States, the frequency range of first local oscillator 13 is desirably between 668 and 1498 MHz so that the frequency range of the frequency difference product of first mixer 15 falls between 608 and 614 MHz, with a nominal picture carrier frequency at 612.75 MHz. The frequency range between 608 and 614 MHz, which corresponds to UHF channel 37, is reserved for radio astronomy and unused for television broadcast. Therefore, the passband of the first IF signal falls in a gap in the UHF television band. As is explained in detail in copending U.S. patent application Ser. No. 508,595 filed on June 28, 1983 in the names of G. C. Hermeling and M. W. Muterspaugh, and assigned to the same assignee as the present invention, since 608 to 614 MHz is a gap in the UHF range, it can be effectively used in a double-conversion tuner intended to tune both VHF and UHF broadcast and VHF cable channels when the cable channels fill the otherwise present gap between the VHF and UHF ranges in which the frequency range of the first IF signal is typically placed. The nominal frequency of second local oscillator 19 is desirably selected at 567 MHz so that the frequency range of the difference frequency product of second mixer 21 is the conventional IF frequency range between 40 and 46, with a nominal picture carrier frequency at 45.75 MHz, employed in the United States.

It is noted from the above that the frequency of the first local oscillator signal is always greater than the frequency of the second local oscillator signal. This recognition enables a relatively simple implementation of a tuner control unit 25.

Tuner control unit 25 generates the tuning control voltage for RF filter 11 and first local oscillator 13 in accordance with the selected channel. Tuner control unit 25 includes a frequency synthesizer which controls the frequency of first local oscillator 13 so that the difference frequency between the first and second local oscillator signals is "locked" (i.e., proportional) to a reference frequency value. In this manner, a change of the frequency of either local oscillator will be compensated for by a corresponding change of the frequency of the first local oscillator signal. As a result, the frequencies of picture carrier and the other carriers of the second IF signal will be maintained at their nominal values.

Specifically, the frequency synthesizer of tuner control unit includes a phase locked loop. The phase locked loop includes very stable crystal oscillator 27 and a frequency divider 29 which divides the frequency of the output signal of crystal oscillator 27 by a fixed division factor R to produce a reference frequency signal having a frequency $$f_{XTAL}/R \quad (1)$$

where $f_{XTAL}$ is the frequency of crystal oscillator 27. The reference frequency signal is coupled to one input of a phase comparator 31. The other input signal of phase comparator 31 is a frequency divided version of a difference frequency signal having a frequency equal to the frequency difference between the first and second local oscillator signals.

The difference frequency signal is developed in the following manner. The first and second local oscillator signals are coupled to respective first and second frequency dividers or "prescalers" 33 and 35, each of which divides the respective local oscillator signals by a division factor $K_1$. The frequency divided version of the first local oscillator signal is coupled to the "up" input of an up/down counter 37 and the frequency divided version of the second local oscillator signal is coupled to the "down" input of up/down counter 37. The count of up/down 37 is increased by one for each pulse (there is one pulse per cycle) of the frequency divided version of the first local oscillator signal and the count of up/down counter is decreased by one for each pulse of the frequency divided version of the second local oscillator signal. Therefore, the count of up/down counter 37 is proportional to the frequency difference between the two local oscillator signals (by a factor of $1/K_1$). A pulse type output signal is derived at the last stage of up/down counter 37. The number of stages of up/down counter 37 is selected to provide additional frequency division by a factor of $K_2$. The output signal of up/down counter 37 has a frequency $$\frac{f_{LO_1} - f_{LO_2}}{K_1 K_2} \quad (2)$$

where $f_{LO_1}$, is the frequency of the first local oscillator and $f_{LO_2}$ is the frequency of the second local oscillator signal.

The output signal of up/down counter 37 is coupled to a programmable frequency divider 39 which divides the frequency of output signal of up/down counter 37 by a programmable factor of N. Division factor N is set (i.e., programmed) in accordance with the selected channel. For that purpose, a channel selector 41, which e.g., may include a calculator-like keyboard, which couples a digital word representing the channel number of the selected channel to programmable frequency divider 39. The output signal of programmable frequency divider 39 has a frequency $$\frac{f_{LO_1} - f_{LO_2}}{K_1 K_2 N} \quad (3)$$

The output signal is coupled to the second input of phase comparator 31.

Phase comparator 31 compares the relative phase of its two input signals to generate an error signal representing their frequency difference. The error signal has positive and negative going pulses the polarity and width of which represent the sense and magnitude of the frequency difference between the two input signals of phase comparator 31. A low pass filter (LPF) 43 filters the pulse error signal to obtain an average voltage representing its average value which is applied to first local oscillator 13 (and to RF filter 11) as the tuning voltage.

The frequency of first local oscillator 13 is controlled in response to the tuning voltage so as to minimize the frequency difference between the two input signals of phase comparator 31. When the frequency difference has been minimized, the frequency of the difference frequency between the two local oscillator signals is proportional to or "locked" to that of the crystal oscillator frequency according to the following equation:

$$f_{LO1} - f_{LO2} = \frac{NK_1K_2}{R} f_{XTAL} \qquad (4)$$

Any frequency drift of either local oscillator from its nominal frequency causes a corresponding change of the tuning voltage to change the frequency of first local oscillator 13 so as to maintain the frequency difference locked to the crystal oscillator frequency. In this manner, the carriers of the second local signal oscillator are maintained at their nominal values.

If the values of $f_{XTAL}$, R, $K_1$, and $K_2$ are selected so that $$\frac{K_1K_2}{R} f_{XTAL} = 1 \text{MHz} \qquad (3)$$

the values of N are conveniently the frequencies, in MHz, of the local oscillator signal required to tune the various channel.

For any given channel, the frequency difference between the frequency of the two local oscillators of a double-conversion tuner is the same as the frequency of the sole local oscillator of a single-conversion tuner. Accordingly, the values of division factor N of programmable frequency divider 39 of phase locked loop tuner control system 25 for double-conversion tuner 5 are the same as those of a phase locked loop tuner control system for a single-conversion tuner. Thus, commercially available tuning control frequency synthesis integrated circuits, such as the MM58142 integrated circuit available from National Semiconductor Corporation of Santa Clara, Calif., which includes phase locked loop components corresponding to crystal oscillator 27, fixed frequency divider ($\div$R) 29, programmable frequency divider ($\div$N) 39 and phase comparator 31 for controlling the sole local oscillator of a single-conversion tuner, may readily be employed.

It is noted that MM58142 integrated circuit includes provisions for selectively coupling an automatic fine tuning (AFT) voltage to the local oscillator in place of the output of the phase comparator and for changing the value of division factor N in increments to account for frequency offsets of RF signals as may be provided by a cable television network. Such offset frequency provision may, therefore, be incorporated with the structure of the present invention shown in FIG. 1. The offset frequency provisions, as well as details of the phase locked loop components themselves, are set forth in detail in U.S. Pat. No. 4,081,549 issued on June 21, 1977 in the names of Rast, Wine and Henderson.

The fact that the frequency of first local oscillator 13 is always greater than the frequency of second local oscillator 19 makes possible the implementation of up/down counter 37 in a particularly simple form as will now be described with respect to FIG. 2. Implementations of prescalers 33 and 35 are also shown in FIG. 2.

Figure 2:
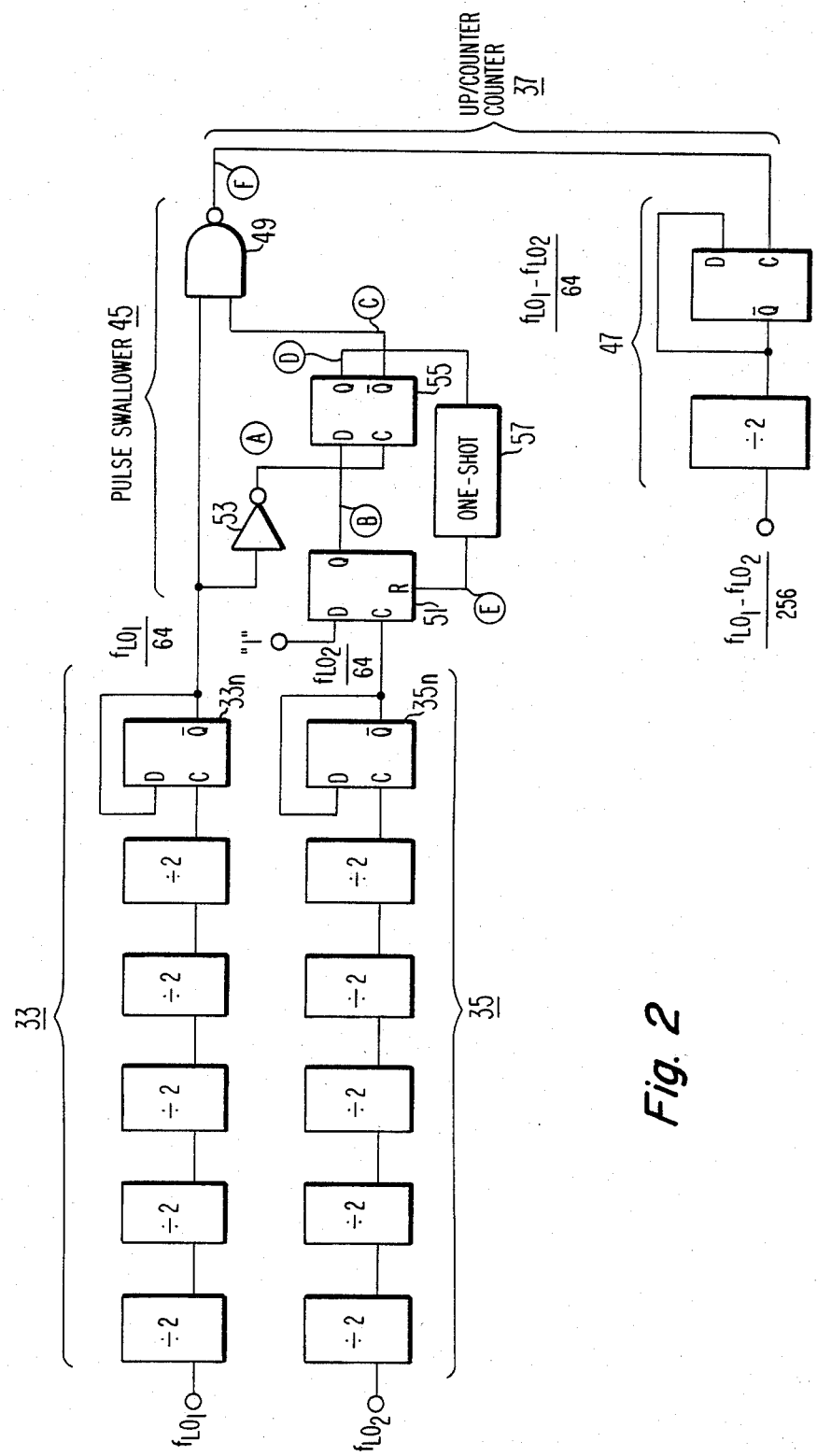
FIG. 2 is a schematic diagram, in logic symbol form, of the preferred form of the up/down counter shown in block form in FIG. 1.

As shown in FIG. 2, each of prescalers 33 and 35 include an equal number of cascaded "divide-by-two" ($\div$2) divider stages. The stages are identical and include, as is typified by respective last stages 33n and 35n, a data type flip-flop with its clock (C) input coupled to the output of the previous stage and its $\overline{Q}$ output coupled back to its data (D) input. As shown each of prescales 33 and 35 includes six divide-by-two stages so that division $K_1$ is equal to $2^6$ or 64.

The output signals of prescalers 33 and 35 are coupled to a "pulse swallower" 45, which supplies a number of pulses to the input of a frequency divider 47 over a given time interval dependent on the difference between the number of pulses produced at the outputs of prescalers 33 and 35 in the given time interval. Frequency divider 47 includes a number of divide-by-two divider-stages for dividing the frequency of the pulse signal provided by pulse swallower 47 by division factor $K_2$ to produce the output signal of up/down counter 37. As shown, frequency divider 47 includes two divide-by-two stages so that division factor $K_2$ is equal to four.

Pulse swallower 45 operates by removing one pulse of the output signal of prescaler 33 ($f_{LO1}/64$) for each pulse of output signal of prescaler 35 ($f_{LO2}/64$). Thus, the number of pulses produced at the output of frequency divider 47 in a given time interval is increased by one for each pulse of the frequency divided version of the first local oscillator signal in the given time interval and decreased by one for each pulse of the frequency divided version of the second local oscillator signal in the given time interval. Viewed another way, the count represented by the binary signals produced at the output of each of the stages of frequency divider 47 is, in essence, increased by one for each pulse of the frequency divided version of the first local oscillator signal and decreased by one for each pulse of the frequency divided version of the second local oscillator signal.

Figure 3:
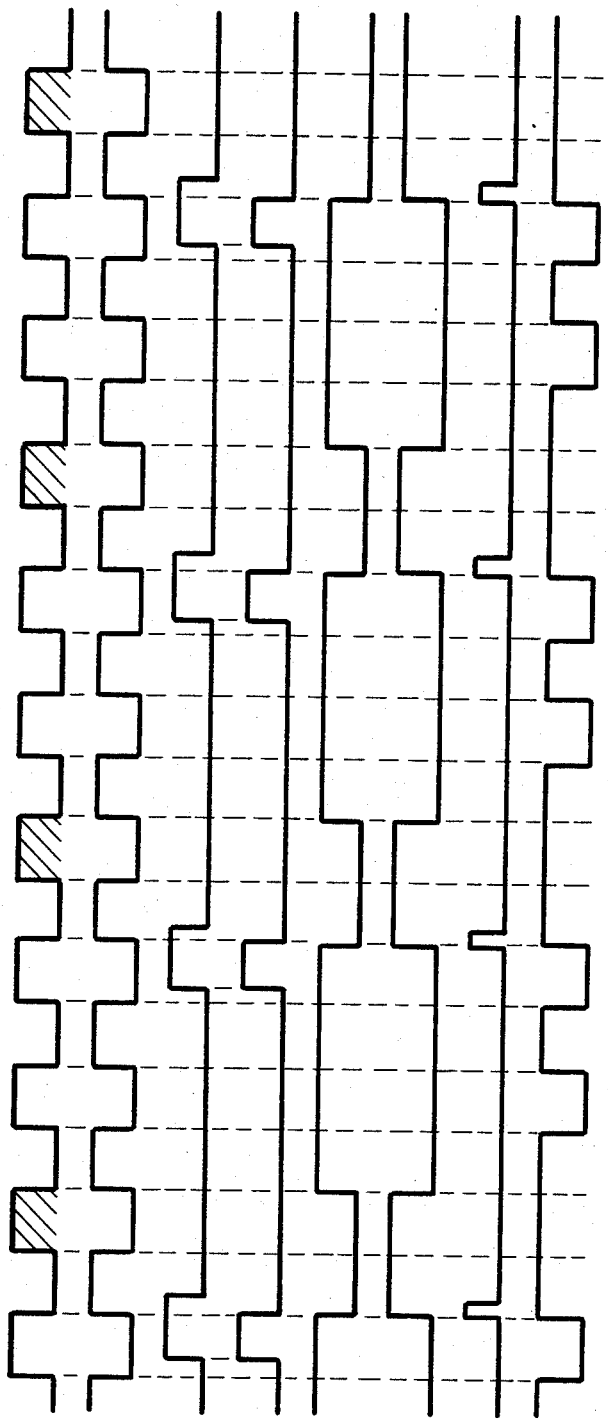
FIG. 3 is a timing diagram of the preferred form of the up/down counter shown in FIG. 2.

The following description of the operation of pulse swallower 45 is made with reference to its timing diagram shown in FIG. 3. The waveforms of the timing diagram of FIG. 3 and signal paths of the schematic of FIG. 2 are correspondingly labelled. For the description of the operation, it should be noted that the clocked logic elements shown in FIG. 3 respond to the positive-going edges of pulse signals.

The output signal of prescaler 33 is coupled to one input of a nand gate 49 by which pulses of the output signal of prescaler 33 are selectively removed. As long as the control signal (C) of nand gate 49 is at the high logic level, the positive-going pulses of the output signal of prescaler 33 are enabled to pass to the output of nand gate 49 (F) in inverted form. When the control signal (C) has the low logic level, the pulses of the output signal of prescaler 33 are disabled from passing to the output of nand gate 49 (F).

The control signal (C) is selectively caused to have the low logic level in response to each pulse of the output signal of prescaler 35 which are applied to the clock (C) input of a data type flip-flop 51. Specifically, each pulse of the output signal of prescaler 35 causes flip-flop 51 to be set causing the high logic to be developed at its Q output (B). Thereafter, in response to the next pulse of an inverted version (A) of the output signal of prescaler 33, generated by an inverter 53, a data type flip-flop 55, to which the Q output signal (B) of data type flip-flop 51 is coupled, is set causing the low logic level to be developed at its $\overline{Q}$ output (C) and the high logic level to be developed at its Q output (D). The low logic level at the $\overline{Q}$ output of flip-flop 55 (C) causes nand gate 49 to be disabled from passing pulses of the output signal of prescaler 33 to its output (F). The pulses of the output signal of prescaler 33 removed by this action are indicated by cross-hatches in FIG. 3. In response to the transition to the high logic level at the Q output of flip-flop 55 (D), a one-shot (or monostable multivibrator) 57 generates a short pulse which is coupled to the reset (R) input of flip-flop 51 and causes it to be reset causing the low logic level to be developed at its Q output (B). In response to the next pulse of the output signal of inverter 53 (A), flip-flop 55 is reset causing the high logic level to be developed at the $\overline{Q}$ output of flip-flop 55 (C). The high logic level at the $\overline{Q}$ output of flip-flop 55 again enables nand gate 49 to pass pulses of the output signal of prescaler 33 to its output (in inverted form).

One-shot 57 is included in the feedback path between the Q output of flip-flop 55 and the reset (R) input flip-flop 51 to prevent flip-flop 51 from being held reset after the occurrence of the pulses of the output signal of prescaler 35 which are intended to set flip-flop 51 in the condition when the frequency of the output signal of prescaler 33 is less than twice the frequency of the output signal of prescaler 33. To prevent this possibility, the timing elements (e.g., a resistor or capacitor, not shown) of one-shot 57 are selected to provide a pulse with a duration shorter than the difference between the period of the output signal of prescaler 35 and the maximum period of the output signal of prescaler 33.

Prescalers 33 and 35 serve to isolate or buffer the outputs of the local oscillators from one another. In addition, prescalers 33 and 35 serve to reduce the frequency of the input signal of programmable divider 39 to a range compatible with its operation. Prescalers 33 and 35 also serve to reduce the frequency of the input signals of pulse swallower 45 so that its timing considerations are less critical. However, with respect to the latter, depending on the frequencies of the local oscillator signals, an equal number of stages of prescalers 33 and 35 can be removed from prescalers 33 and 35 and put in frequency divider 47 instead to reduce the number of frequency dividing stages.

While the frequency synthesizer of tuner control system 25 is shown as comprising a phase locked loop, other types of frequency synthesizers may be employed. For example, the contents of an up/down counter corresponding in function to up/down counter 37 may be digitally compared to a reference frequency value represented by a digital word to generate the control signal for a local oscillator.

These and other modifications are contemplated to be within the scope of the present invention defined in the following claims.

What is claimed is:

1. Control apparatus for a double-conversion tuner for tuning an RF signal corresponding to a selected channel, said double-conversion tuner including a first oscillator for generating a first local oscillator signal having a frequency controlled in response to a control signal and a second local oscillator for generating a second local oscillator signal, comprising:

counting means having first and second inputs coupled to receive first and second input pulse signals for producing at an output an output pulse signal having a number of pulses in a given time interval which number increases with each pulse of one said input pulse signals in said given time interval and which number decreases with each pulse of the other one of said input pulse signals in said given time interval;

first coupling means for coupling said first local oscillator signal to said first input of said counting means as said second input pulse signal;

second coupling means for coupling said second local oscillator signal to said second input of said counting means as said second input pulse signal;

a source of a reference frequency signal; and comparing means for comparing the frequency of said output pulse signal of said counting means and the frequency of said reference frequency signal to generate said control signal for said first local oscillator.

2. The apparatus recited in claim 1, wherein:

said counting means includes pulse swallowing means having inputs coupled to said first and second inputs of said counting means and an output coupled to the output of said counting means for normally coupling pulses of said one of said input pulse signals to its said output but selectively removing one pulse of said one of said input pulse signals in response to each pulse of said other one of said input pulse signals.

3. The apparatus recited in claim 2, wherein:

output frequency dividing means is coupled between said output of said pulse swallowing means and said output of said counting means for dividing the frequency of the output signal of said pulse swallowing means.

4. The apparatus recited in claim 2, wherein:

first and second input frequency dividing means are coupled between said first and second local oscillators and said first and second inputs for dividing the frequencies of said first and second local oscillator signals by the same division factor, respectively.

5. The apparatus recited in claim 4, wherein:

said one of said input pulse signals is said first input pulse signal and said other one of said input pulse signals is said second input pulse signal.

6. The apparatus recited in claim 1, wherein:

first and second input frequency dividing means are coupled between said first and second local oscillators and said first and second inputs for dividing the frequencies of said first and second local oscillator signals by the same division factor, respectively.

7. The apparatus recited in claim 6, wherein:

said comparing means includes programmable frequency dividing means for dividing the frequency of the output signal of said counting means by a division factor corresponding to said selected channel; and phase comparing means for comparing the relative phases of the output signal of said programmable dividing means and said reference frequency signal to generate said control signal.

8. Control apparatus for a double-conversion tuner, said double-conversion tuner including first and second local oscillators for generating first and second local oscillator signals, one of said local oscillator signals having a frequency controlled in response to a tuning control signal, comprising:

up/down counting means having first and second inputs coupled to receive first and second input pulse signals for counting in the increasing sense in response to one of said input pulse signals and for counting in the decreasing sense in response to the other one of said input pulse signals; and first coupling means for coupling said first local oscillator signal to said first input of said up/down counting means as said second input pulse signal;

second coupling means for coupling said second local oscillator signal to said second input of said up/down counting means as said second input pulse signal;

comparing means coupled to said up/down counting means and responsive to its count for generating an error signal representing the frequency deviation between the difference frequency between said first and second pulse signals and a reference frequency value; and tuning control signal generating means responsive to said error signal for generating said tuning control signal.

9. The apparatus recited in claim 8, wherein:
first and second input frequency dividing means are coupled between said first and second local oscillators and said first and second inputs for dividing the frequencies of said first and second local oscillator signals by the same division factor, respectively.

10. The apparatus recited in claim 8, wherein:
said one of said input pulse signals is said first input pulse signal and said other one of said input signals is said second input pulse signal.

11. Control apparatus for a double-conversion tuner for tuning RF signals corresponding to respective channels, said double-conversion tuner including a first local oscillator for generating a first local oscillator signal having a frequency controlled in response to a tuning control signal and a second local oscillator for generating a second local oscillator signal, comprising:

pulse swallowing means having first and second inputs coupled to receive first and second input pulse signals and an output for normally coupling pulses of one of said input pulse signals to its said output but selectively removing a predetermined number of pulses of said one of said input pulse signals in response to a predetermined number of pulses of said other one of said input pulse signals to generate an output pulse signal at said output;

first coupling means for coupling said first local oscillator signal to said first input of said counting means as said second input pulse signal;

second coupling means for coupling said second local oscillator signal to said second input of said counting means as said second input pulse signal;

a source of a reference frequency signal;

comparing means for comparing the frequency of said output pulse signal and said reference frequency signal to generate said control signal.

12. The apparatus recited in claim 11, wherein:
output frequency dividing means is coupled between said output of said pulse swallowing means and said comparing means for dividing the frequency of said output pulse signal.

13. The apparatus recited in claim 11, wherein:
first and second input frequency dividing means are coupled between said first and second local oscillators and said first and second inputs for dividing the frequencies of said first and second local oscillator signals by the same division factor, respectively.

14. The apparatus recited in claim 11, wherein:
said comparing means includes programmable frequency dividing means for dividing the frequency of the output signal of said pulse swallowing means by a division factor corresponding to said selected channel; and phase comparing means for comparing the relative phases of the output signal of said programmable divider means and said reference frequency signal to generate said control signal.

15. The apparatus recited in claim 14, wherein:
said one of said input pulse signals is said first input pulse signal and said other one of said input pulse signals is said second input pulse signal.

* * * * *